United States Patent
Seo et al.

(10) Patent No.: US 8,823,005 B2
(45) Date of Patent: Sep. 2, 2014

(54) THIN-FILM TRANSISTOR AND METHOD OF MANUFACTURING THE SAME

(75) Inventors: O-Sung Seo, Seoul (KR); Seong-Hun Kim, Seoul (KR); Yang-Ho Bae, Seoul (KR); Jean-Ho Song, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 617 days.

(21) Appl. No.: 13/167,668

(22) Filed: Jun. 23, 2011

(65) Prior Publication Data

US 2012/0037913 A1 Feb. 16, 2012

(30) Foreign Application Priority Data

Aug. 10, 2010 (KR) ........................ 10-2010-0076910

(51) Int. Cl.
*H01L 29/66* (2006.01)
*H01L 29/45* (2006.01)
*H01L 29/786* (2006.01)

(52) U.S. Cl.
CPC .... *H01L 29/78618* (2013.01); *H01L 29/66765* (2013.01); *H01L 29/458* (2013.01)
USPC .. 257/60; 257/66; 257/E29.273; 257/E21.411

(58) Field of Classification Search
CPC .................. H01L 29/4908; H01L 51/0508
USPC ....................... 257/60, 66, E29.273, E21.411
See application file for complete search history.

(56) References Cited

U.S. PATENT DOCUMENTS

2006/0065892 A1* 3/2006 Lee et al. .................. 257/59
2010/0133539 A1* 6/2010 Kang et al. ................ 257/59

* cited by examiner

*Primary Examiner* — Marc Armand
(74) *Attorney, Agent, or Firm* — H.C. Park & Associates, PLC

(57) ABSTRACT

A thin-film transistor (TFT) and a method of manufacturing the same are disclosed herein. The TFT may include a gate electrode disposed on an insulating substrate, an insulating layer disposed on the insulating substrate and the gate electrode, an active layer pattern disposed on the insulating layer to overlap the gate electrode, a source electrode disposed on the insulating layer and at least part of which overlaps the active layer pattern, and a drain electrode which is separated from the source electrode and at least part of which overlaps the active layer pattern. A first ohmic contact layer pattern may be disposed between the active layer pattern and the source electrode and between the active layer pattern and the drain electrode. The first ohmic contact layer may have higher nitrogen content on its surface than in other portions of the first ohmic contact layer.

10 Claims, 7 Drawing Sheets

THIN-FILM TRANSISTOR AND METHOD OF MANUFACTURING THE SAME

This application claims priority from and the benefit of Korean Patent Application No. 10-2010-0076910, filed on Aug. 10, 2010, which is hereby incorporated by reference for all purposes as if fully set forth herein.

BACKGROUND OF THE INVENTION

1. Field of the Invention

Exemplary embodiments of the present invention relate to a thin-film transistor (TFT) and a method of manufacturing the same.

2. Description of the Background

Liquid crystal displays (LCDs) are one of the most widely-used flat panel displays. Generally, an LCD includes two substrates having electrodes and a liquid crystal layer interposed between the substrates. In an LCD, voltages can be applied to the electrodes to rearrange liquid crystal molecules of the liquid crystal layer, thereby controlling the amount of light that passes through the liquid crystal layer. As a result, a desired image is displayed on the LCD.

An LCD may include a thin-film transistor (TFT) configured to switch each pixel of the LCD. A TFT is a switching element that uses a gate electrode which receives a switching signal, a source electrode which receives a data voltage, and a drain electrode which outputs the data voltage, as its three terminals. In addition, the TFT includes an active layer formed between the gate electrode and the source and drain electrodes.

The gate electrode, active layer, source electrode, and drain electrode of a TFT may be formed using thin films.

A thickness of a thin film in TFT can impact manufacturing productivity. For example, a thin film deposited too thickly may be a problem, since a thick thin film may reduce productivity and make it difficult to pattern the thin film, and to secure process uniformity and margins.

SUMMARY OF THE INVENTION

Exemplary embodiments of the present invention provide a thin-film transistor (TFT) in which a thickness of source and drain electrodes is reduced without deteriorating characteristics of the TFT thereby improving productivity and securing process uniformity and margins.

Exemplary embodiments of the present invention provide a method of manufacturing the TFT.

Additional features of the exemplary embodiments will be set forth in the description which follows, and in part will be apparent from the description, or may be learned by practice of the invention.

Exemplary embodiments of the present invention disclose a TFT including: a gate electrode which is disposed on an insulating substrate; an insulating layer which is disposed on the insulating substrate and the gate electrode; an active layer pattern which is disposed on the insulating layer to overlap the gate electrode; a source electrode which is disposed on the insulating layer and at least part of which overlaps the active layer pattern and a drain electrode which is separated from the source electrode and at least part of which overlaps the active layer pattern; and a first ohmic contact layer pattern which is disposed between the active layer pattern and the source electrode and between the active layer pattern and the drain electrode and has higher nitrogen content in a surface thereof than in the other portions.

Exemplary embodiments of the present invention also disclose a method of manufacturing a TFT. The method includes: forming a gate electrode on an insulating substrate; forming an insulating layer on the insulating substrate and the gate electrode; forming an active layer on the insulating layer; forming a first material layer, which is used to form an ohmic contact, on the active layer; nitriding a surface of the first material layer; and forming a source electrode and a drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Advantages and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and will fully convey the concept of the invention to those skilled in the art. Like reference numerals refer to like elements throughout the specification.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" or "beneath" can encompass both an orientation of above and below. The device may be otherwise oriented and the spatially relative descriptors used herein interpreted accordingly.

As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The term "thin-film transistor (TFT) substrate" as used herein refers to a substrate comprising at least one TFT but does not preclude the intervention of another structure between the TFT and the substrate or the presence of additional structures formed thereon.

Figure 1:
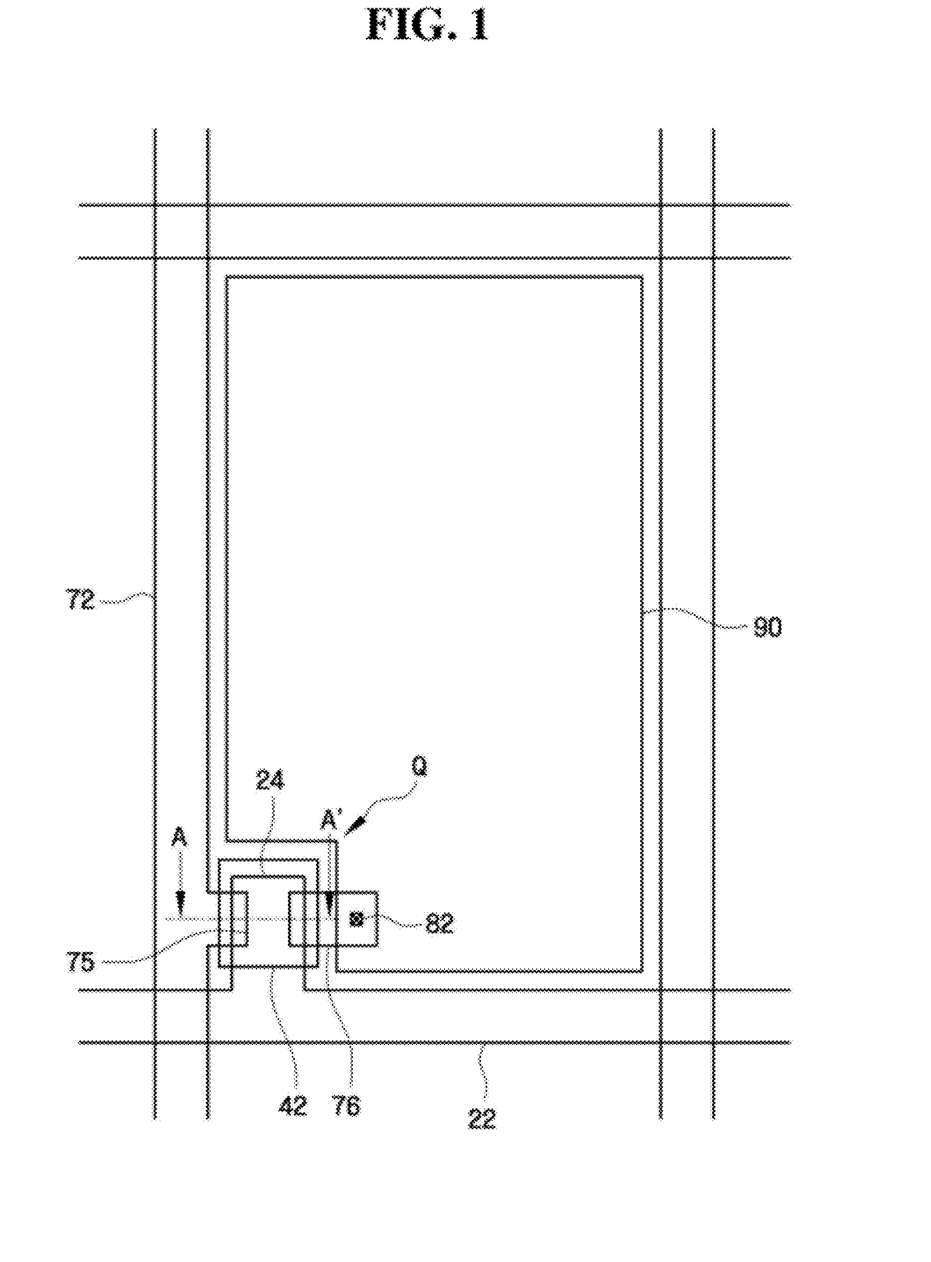
FIG. 1 is a layout view of a thin-film transistor (TFT) substrate according to exemplary embodiments of the present invention
Figure 2:
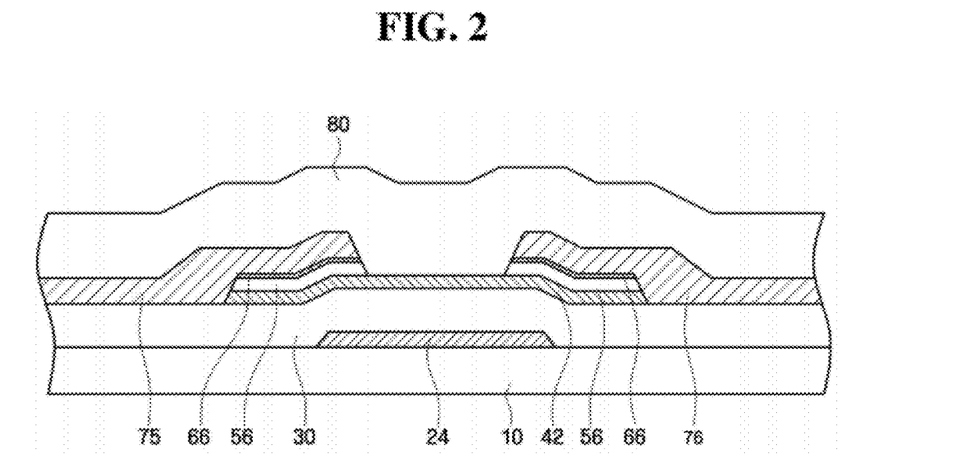
FIG. 2 is a cross-sectional view taken along line A-A' of the TFT substrate in FIG. 1 according to exemplary embodiments of the present invention.

Hereinafter, the structure of a TFT substrate according to exemplary embodiments of the present invention will be described in detail with reference to the accompanying drawings. FIG. 1 is a layout view of a TFT substrate according to exemplary embodiments of the present invention. FIG. 2 is a cross-sectional view taken along line A-A' of the TFT substrate in FIG. 1 according to exemplary embodiments of the present invention.

Referring to FIG. 1 and FIG. 2, gate wirings 22 and 24, which deliver gate signals, may be formed on an insulating substrate 10. The gate wirings 22 and 24 may include a gate line 22 and a gate electrode 24. The gate line 22 may extend in a direction, e.g., a horizontal direction, and the gate electrode 24 may project from the gate line 22 in the form of a protrusion. The insulating substrate 10 may be made of any suitable material including, for example, transparent glass or plastic. Each of gate wirings 22 and 24 may be a single layer or a multilayer containing at least one of Copper (Cu), Molybdenum (Mo), Aluminum (Al), Silver (Ag), Titanium (Ti), Niobium (Nb), Tungsten (W), Chromium (Cr), Tantalum (Ta), and/or an alloy of these materials. For example, the gate electrode 24 may be a single layer made of a single metal such as Mo or Cu. Alternatively, the gate electrode 24 may be a double layer composed of Cr and Al or Ti and Cu, or a triple layer composed of Mo, Al, and Mo. The layers may be arranged in any suitable order. For example, in some cases, the Ti may be a lower layer and the Cu may be an upper layer. In some cases, the Ti may be an upper layer and the Cu may be a lower layer. However, exemplary embodiments of the present invention are not limited to the above examples, and the gate wirings 22 and 24 may be made of various metals or conductors.

A gate insulating film 30 may be disposed on the insulating substrate 10 and the gate wirings 22 and 24. The gate insulating film 30 may be made of any suitable material including, for example, Silicon Oxide (SiOx) or Silicon Nitride (SiNx). Alternatively, the gate insulating film 30 may contain aluminum oxide, titanium oxide, tantalum oxide, or zirconium oxide.

An active layer pattern 42 for forming a channel of the TFT Q may be disposed on the gate insulating film 30. The active layer pattern 42 may overlap at least the gate electrode 24. The active layer pattern 42 overlapping the gate electrode 24 may be island-shaped. However, exemplary embodiments of the present invention are not limited thereto, and the shape of the active layer pattern 42 may vary. For example, the active layer pattern 42 overlapping the gate electrode 24 may have substantially the same linear shape as data wirings (i.e., data line 72, source electrode 75, and drain electrode 76). The active layer pattern 42 may contain any suitable material including, for example, amorphous silicon, polysilicon, or oxide semiconductor. Here, the oxide semiconductor may be any one material selected from the group consisting of InZnO, InGaO, InSnO, ZnSnO, GaSnO, GaZnO, GaZnSnO, GaInZnO, HfInZnO, and ZnO, where In is indium, Zn is zinc, O is oxygen, Ga is gallium, Sn is Tin, and Hf is Hafnium.

A source electrode 75 and a drain electrode 76 may be disposed on the gate insulating film 30 and the active layer pattern 42. At least part of the source electrode 75 may overlap the active layer pattern 42. The drain electrode 76 may be separated from the source electrode 75 and may face the source electrode 75 with respect to a channel region of the active layer pattern 42. In addition, at least part of the drain electrode 76 may overlap the active layer pattern 42. The source electrode 75 may receive a data signal from a data line 72 which extends in a direction (e.g., a vertical direction) intersecting the gate line 22. The source electrode 75 and the drain electrode 76 may be made of a single layer or a multi-layer containing any suitable material, including, for example, at least one of Cu, Mo, Al, Ag, Ti, Nb, W, Cr, Ta, and an alloy of these materials.

Figure 12:
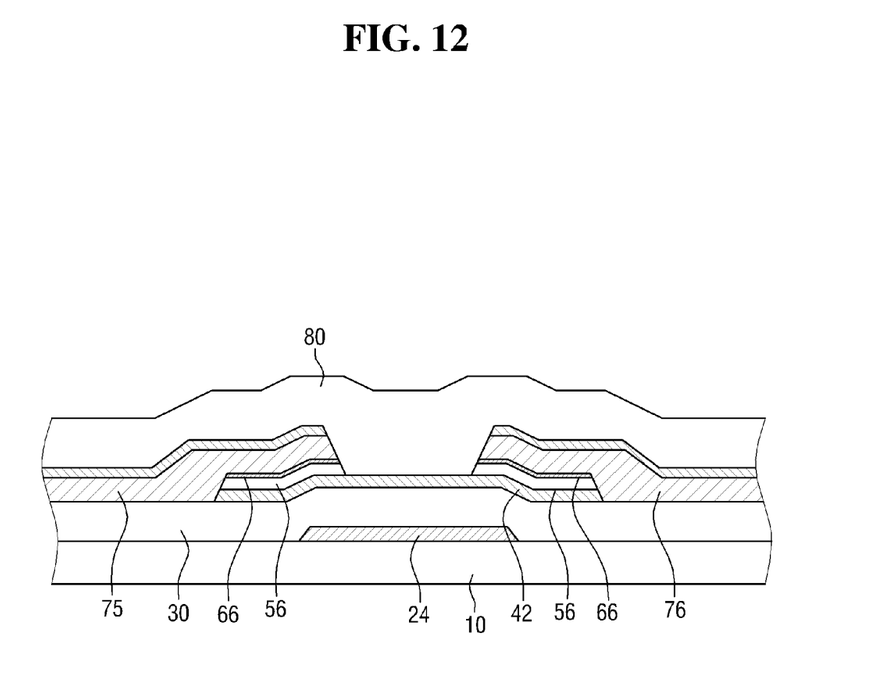
FIG. 12 is a cross-sectional view taken along line A-A' of the TFT substrate in FIG. 1 according to exemplary embodiments of the present invention.

In some cases, the source electrode 75 and the drain electrode 76 may have a double layer of Ti and Cu (see FIG. 12). The lower layer may be a Ti layer, and may function as a diffusion-preventing layer that prevents metal atoms of an upper layer, which may be a Cu layer, from diffusing into the active layer pattern 42. To function as a diffusion-preventing layer, the lower layer of the source electrode 75 and the drain electrode 76 should be thicker than a predetermined thickness. If the thickness of the diffusion-preventing layer, i.e., the lower layer of the source electrode 75 and the drain electrode 76, is smaller than the predetermined thickness, the metal atoms of the upper layer of the diffusion-preventing layer may diffuse into the active layer pattern 42, thereby deteriorating characteristics of the TFT Q. For example, the metal atoms may reduce an ON current Ion of the TFT Q while increasing an OFF current Ioff of the TFT Q. However, if the thickness of the diffusion-preventing layer is increased, the thickness of the source electrode 75 and the drain electrode 76 may also increase. This makes a deposition and a patterning process for forming the source electrode 75 and the drain electrode 76 difficult. Consequently, productivity is reduced, and process uniformity and margins become harder to secure.

Therefore, according to exemplary embodiments of the present invention, a thin diffusion-preventing layer pattern 66 is additionally disposed on an ohmic contact layer pattern 56 as further described below. The thickness of the diffusion-preventing layer (e.g., the Ti layer) of the source electrode 75 and the drain electrode 76 can be reduced, which, in turn, reduces the total thickness of the source electrode 75 and the drain electrode 76. The thickness of the diffusion-preventing layer (e.g., Ti layer) may be, for example, smaller than 100 Å and greater than 10 Å.

The ohmic contact layer pattern 56 may be disposed between the active layer pattern 42 and the source electrode 75 and between the active layer pattern 42 and the drain electrode 76 to enhance ohmic contact characteristics therebetween. The diffusion-preventing layer pattern 66 may be disposed on the ohmic contact layer pattern 56 to prevent metal atoms of the source and drain electrodes 75 and 76 from diffusing into the active layer pattern 42. In other words, a stacked structure of the ohmic contact layer pattern 56 and the diffusion-preventing layer pattern 66 may be disposed between the active layer pattern 42 and the source electrode 75 and between the active layer pattern 42 and the drain electrode 76.

The ohmic contact layer pattern 56 may include an amorphous silicon layer containing impurities, e.g., n-type impurities. The diffusion-preventing layer pattern 66 may be formed using any suitable method, including, for example, by surface nitriding of a material layer (e.g., an amorphous silicon layer containing n-type impurities), which is used to form the ohmic contact layer pattern 56. Accordingly, the diffusion-preventing layer pattern 66 may be very thin (e.g., a thickness of 20 Å or less). If the diffusion-preventing layer pattern 66 is formed relatively thick using a chemical vapor deposition (CVD) method, the ohmic contact characteristics of the ohmic contact layer pattern 56 may degrade, resulting in a sharp reduction in the ON current Ion of the TFT Q. However, when the diffusion-preventing layer pattern 66 is formed relatively thin by using the surface nitriding method, the ohmic contact characteristics of the ohmic contact layer pattern 56 do not degrade, and can function as a diffusion-preventing layer, together with the lower layer (e.g., the Ti layer) of the source electrode 75 and the drain electrode 76.

Consequently, the diffusion-preventing layer pattern 66 has higher nitrogen content than the ohmic contact layer pattern 56. The method of forming the ohmic contact layer pattern 56 and the diffusion-preventing layer pattern 66 will be described in more detail below.

A passivation film 80 may be disposed on the source electrode 75 and the drain electrode 76 and a portion of the active layer pattern 42, which is exposed between the source electrode 75 and the drain electrode 76. The passivation film 80 may have a single-film or multi-film structure containing any suitable material including, for example, silicon oxide, silicon nitride, an organic material having photosensitivity, or a low-k insulating material such as a-Si:C:O or a-Si:O:F, where C is carbon, O is oxygen, and F is fluorine. A contact hole 82, which exposes an end of the drain electrode 76, may be formed in the passivation film 80.

A pixel electrode 90 may be formed on the passivation film 80 and may be electrically connected to the drain electrode 76 through the contact hole 82. The pixel electrode 90 may be made of any suitable material including, for example, a transparent conductor, such as indium tin oxide (ITO) or indium zinc oxide (IZO).

Hereinafter, a method of manufacturing the TFT substrate according to exemplary embodiments of the present invention will be described in detail with reference to FIG. 1, FIG. 2, FIG. 3, FIG. 4, FIG. 5, FIG. 6, and FIG. 7. FIG. 3, FIG. 4, FIG. 5, FIG. 6, and FIG. 7 are views illustrating intermediate processes of the method of manufacturing the TFT substrate shown in FIG. 1 and FIG. 2.

Figure 3:
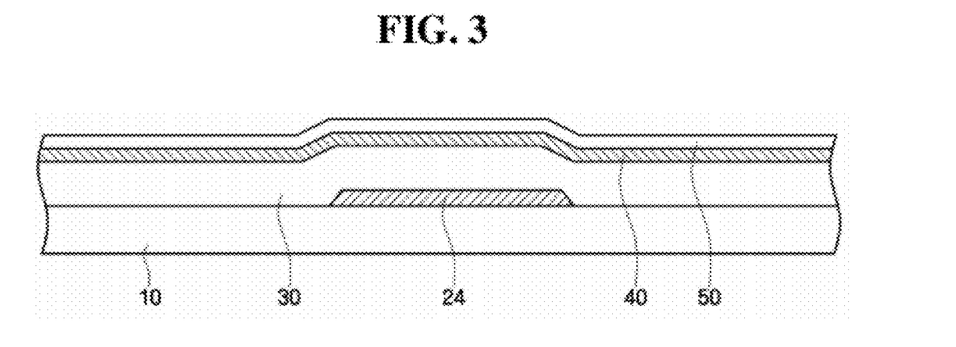
FIG. 3, FIG. 4, FIG. 5, FIG. 6, and FIG. 7 are cross-sectional views illustrating a method of manufacturing the TFT substrate of FIG. 2 according to the exemplary embodiments of the present invention.

Referring to FIG. 1 and FIG. 3, a gate wiring metal layer may be deposited on the insulating substrate 10 and may then be patterned to form the gate wirings 22 and 24. The gate wiring metal layer may be deposited by sputtering, and patterned by a photolithography process. The photolithography process involves a photo process and an etching process. In the photo process, photoresist may be coated on the gate wiring metal layer and may be exposed and developed using a mask. In the etching process, portions of the gate wiring metal layer exposed by a photoresist pattern, which is formed using the photo process, may be dry-etched or wet-etched.

Next, the gate insulating film 30 may be formed on the insulating substrate 10 and the gate wirings 22 and 24 by sputtering or CVD.

Then, an active layer 40 for forming a channel of the TFT Q may be disposed on the gate insulating film 30. As described above, the active layer 40 may contain amorphous silicon, polysilicon, or oxide semiconductor. In addition, the active layer 40 may be formed by sputtering or CVD.

Next, an ohmic contact material layer 50 may be formed on the active layer 40. The ohmic contact material layer 50 may be any suitable material including, for example, an amorphous silicon layer containing impurities, e.g., n-type impurities, and may be formed using CVD. In other words, the ohmic contact material layer 50 may be formed by CVD in the presence of a gas that contains n-type impurities (e.g., phosphorous), so that the n-type impurities can be contained in the amorphous silicon layer.

Figure 4:
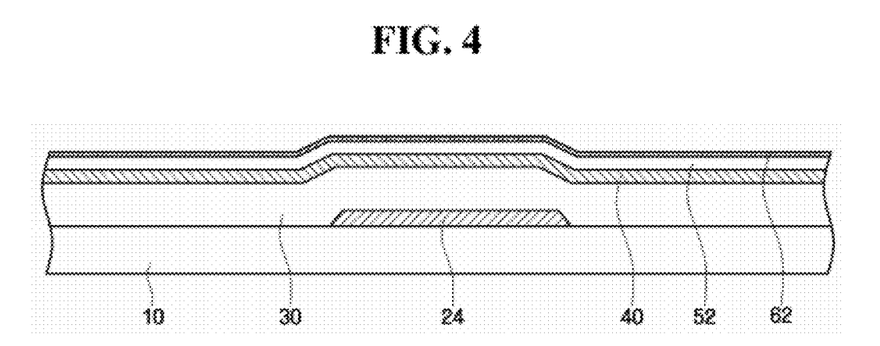

Referring to FIG. 1 and FIG. 4, a surface of the ohmic contact material layer 50 may be treated with nitride. As a result, the ohmic contact material layer 50 may form a nitride surface layer 62 and a non-nitride layer 52 (i.e., portion of the ohmic contact material layer 50 with little or no nitride treatment). The non-nitride layer 52 of the ohmic contact material layer 50 may function as an ohmic contact, and may therefore enhance ohmic contact characteristics between the active layer pattern 42 and the source electrode 75 and between the active layer pattern 42 and the drain electrode 76. The non-nitride layer 52 will hereinafter be referred to as an ohmic contact layer 52. The nitride surface layer 62 of the ohmic contact material layer 50 may prevent metal atoms of the source electrode 75 and the drain electrode 76 from diffusing into the active layer 40, instead of functioning as an ohmic contact. Accordingly, the nitride surface layer 62 will hereinafter be referred to as a diffusion-preventing layer 62.

Treating the surface of the ohmic contact material layer 50 with nitride for forming the diffusion-preventing layer 62 may be performed as follows.

After the ohmic contact material layer 50 is formed, the surface of the ohmic contact material layer 50 may be treated with nitride by flowing a nitrogen-containing gas (e.g., an $N_2$ gas) or performing plasma treatment using a nitrogen-containing gas (e.g., an $N_2$ gas) on the surface of the ohmic contact material layer 50. The process of forming the ohmic contact material layer 50 and the process of flowing the $N_2$ gas or performing plasma treatment may be conducted successively within the same chamber. Thus, the diffusion-preventing layer 62 can easily be formed without complicating the manufacturing process or increasing the processing time. In addition, the flowing of the $N_2$ gas or plasma treatment may be performed in a state where power is not supplied, in order to form the thin diffusion-preventing layer 62.

Figure 5:
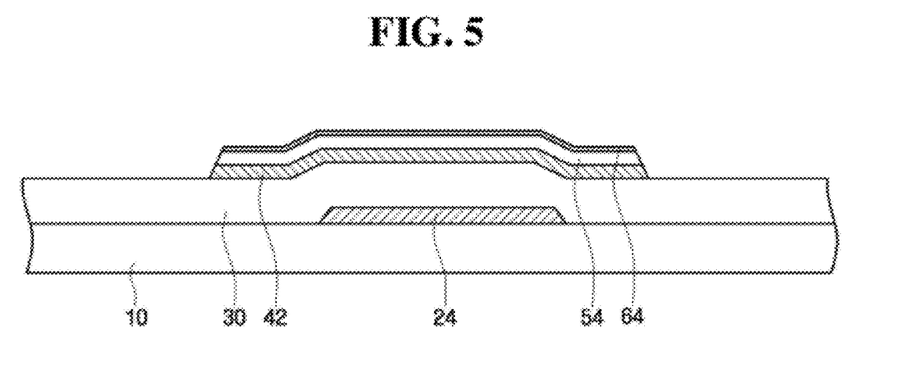

Next, referring to FIG. 1 and FIG. 5, the diffusion-preventing layer 62, the ohmic contact layer 52, and the active layer 40 are patterned using any suitable patterning procedure, including, for example, a photolithography process, thereby forming the active layer pattern 42, an etched ohmic contact layer 54, and an etched diffusion-preventing layer 64. The etched ohmic contact layer 54 and the etched diffusion-preventing layer 64 may be formed on the active layer pattern 42 and may have substantially the same shape and/or pattern as the active layer pattern 42.

Figure 6:
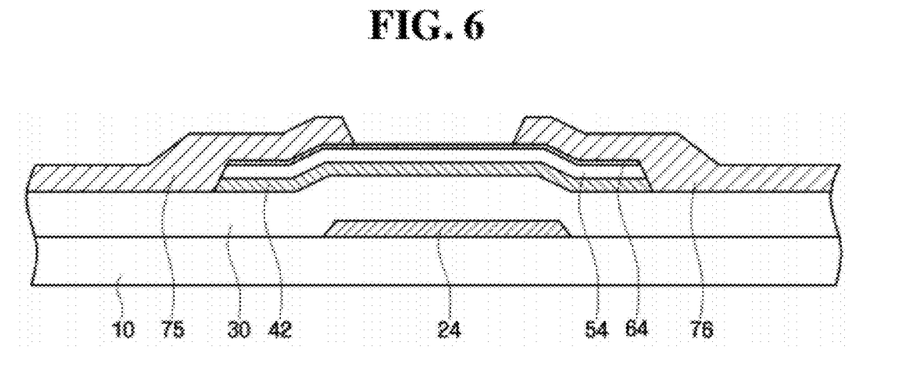

Referring to FIG. 1 and FIG. 6, a data wiring metal layer may be deposited on the gate insulating film 30, the active layer pattern 42, the etched ohmic contact layer 54, and the etched diffusion-preventing layer 64. The data wiring metal layer may then be patterned to form the source electrode 75, the drain electrode 76, and the data line 72. At least part of the source electrode 75 may overlap the active layer pattern 42. The drain electrode 76 may be separated from the source electrode 75 and may face the source electrode 75 with respect to the channel region of the active layer pattern 42. In addition, at least part of the drain electrode 76 may overlap the active layer pattern 42. The data line 72 may extend in a direction (e.g., a vertical direction) intersecting the gate line 22, and may connect to the source electrode 75 so as to deliver a data signal.

The data wiring metal layer may be made of a single layer or a multilayer containing any suitable material including, for example, at least one of Cu, Mo, Al, Ag, Ti, Nb, W, Cr, Ta, and an alloy of these materials. The data wiring metal layer may be formed as a double layer of Ti and Cu. In some cases, the lower layer may be a Ti layer, and may function as a diffusion-preventing layer that prevents metal atoms of an upper layer from diffusing into the active layer pattern 42. The upper layer may be a Cu layer.

Since the thin diffusion-preventing layer 64 may be formed on the ohmic contact layer 54, the thickness of the lower layer (e.g., the Ti layer) of the data line 72, source electrode 75, and drain electrode 76 can be reduced. For example, the thickness of the Ti layer may be smaller than 100 Å and greater than 10 Å. Therefore, the data wiring metal layer can be easily deposited and patterned.

Figure 7:
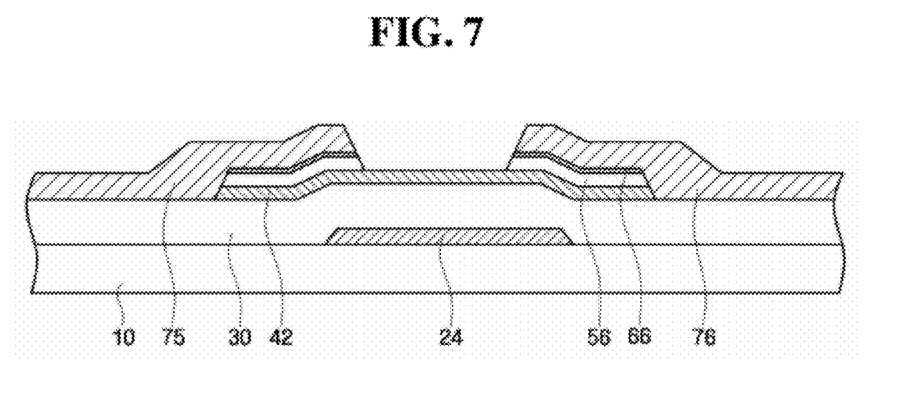

Referring to FIG. 1 and FIG. 7, a portion of the diffusion-preventing layer 64 and a portion of the ohmic contact layer 54 which are exposed between the source electrode 75 and the drain electrode 76 may be removed using any suitable procedure including, for example, an etching process, thereby forming a stacked structure of the ohmic contact layer pattern 56 and the diffusion-preventing layer pattern 66 between the active layer pattern 42 and the source electrode 75 and between the active layer pattern 42 and the drain electrode 76. For example, a portion of the diffusion-preventing layer 64 and a portion of the ohmic contact layer 54 may be etched using the source electrode 75 and the drain electrode 76 as masks in the etching process thereby forming a stacked structure of the ohmic contact layer pattern 56 and the diffusion-preventing layer pattern 66. The ohmic contact layer pattern 56 and the diffusion-preventing layer pattern 66 may therefore have substantially the same pattern. It can be appreciated from FIG. 7 that the diffusion-preventing layer 64 and the ohmic contact layer 54 may be etched with little or no etching of the active layer pattern 42. Accordingly, the ohmic contact layer pattern 56 and the diffusion-preventing layer pattern 66 may overlap the active layer pattern 42 and have substantially the same pattern as the active layer pattern 42, except in a channel region of the active layer pattern 42.

Referring to FIG. 1 and FIG. 2, the passivation film 80 may be formed on the source electrode 75 and the drain electrode 76, and on a portion of the active layer pattern 42 which is exposed between the source electrode 75 and the drain electrode 76.

Then, the contact hole 82, which exposes an end of the drain electrode 76, may be formed in the passivation film 80 by using a photolithography process.

Next, a pixel electrode conductive layer, e.g., ITO or IZO, may be formed on the passivation film 80 having the contact hole 82 and may be patterned, thereby forming the pixel electrode 90, which is electrically connected to the drain electrode 76 through the contact hole 82.

Figure 8:
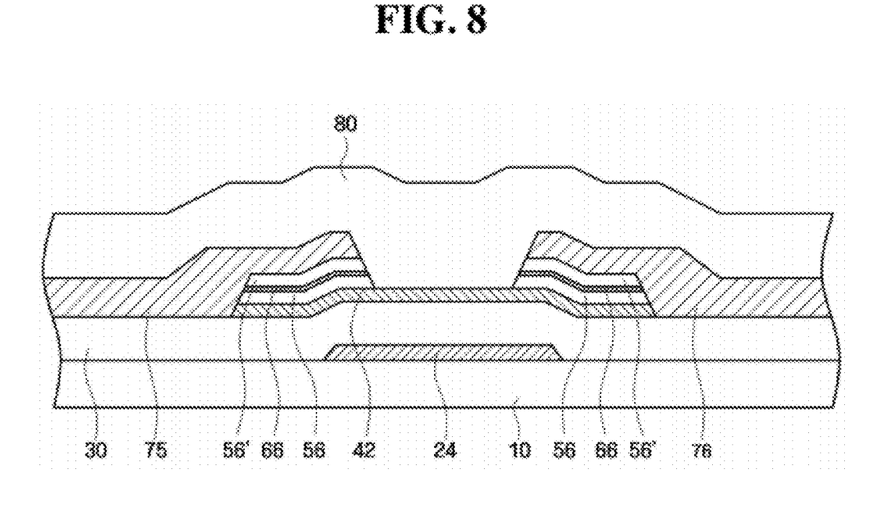
FIG. 8 is a cross-sectional view of a TFT substrate according to exemplary embodiments of the present invention.

Hereinafter, the structure of a TFT substrate according to exemplary embodiments of the present invention and a method of manufacturing the TFT substrate will be described with reference to FIG. 8. FIG. 8 is a cross-sectional view of a TFT substrate according to exemplary embodiments of the present invention.

The TFT substrate in FIG. 8 is substantially the same as the TFT substrate in FIG. 2 except that an ohmic contact layer pattern 56' is additionally formed on a diffusion-preventing layer pattern 66. A detailed description of elements in FIG. 8 identical to elements described above with reference to FIG. 2, FIG. 3, FIG. 4, FIG. 5, FIG. 6, and FIG. 7 will be omitted. For clarification purposes, the ohmic contact layer pattern 56 of FIG. 2 will be referred to as a first ohmic contact layer pattern 56, and the ohmic contact layer pattern 56' additionally formed, as shown in FIG. 8, will be referred to as a second ohmic contact layer pattern 56'.

Referring to FIG. 8, the diffusion-preventing layer pattern 66 may be interposed between the first ohmic contact layer pattern 56 and second ohmic contact layer pattern 56'. The first ohmic contact layer pattern 56 and the second ohmic contact layer pattern 56', which enhance ohmic contact characteristics, may be disposed between an active layer pattern 42 and a source electrode 75 and between the active layer pattern 42 and a drain electrode 76.

The first ohmic contact layer pattern 56 and a diffusion-preventing layer 62 of FIG. 8 may be formed according to the manufacturing method described above with reference to FIG. 2, FIG. 3, FIG. 4, FIG. 5, FIG. 6, and FIG. 7. In addition, a material layer may be disposed on the diffusion-preventing layer 62 to form the second ohmic contact layer pattern 56'. The second ohmic contact layer pattern 56' may be formed in the same manner as the ohmic contact material layer 50 was formed. For example, an amorphous silicon layer containing impurities (e.g., n-type impurities) may be deposited on the diffusion-preventing layer 62 by using a CVD method. The ohmic contact layer 52, the diffusion-preventing layer 62, and the material layer may be formed successively within the same chamber.

Characteristics of a TFT formed according to exemplary embodiments of the present invention will now be described.

As a comparative example, current characteristics of a conventional TFT in which a diffusion-preventing pattern is not formed on an ohmic contact layer pattern will be described with reference to TABLE 1 below. TABLE 1 and FIG. 9 show the variation in the ON current Ion and the OFF current Ioff of the conventional TFT with respect to a thickness of a Ti layer when a source electrode and a drain electrode of the conventional TFT are made of double layers of Ti and Cu.

TABLE 1

| Ti thickness (Å) | Ion (mA) | Ioff (mA) |
| --- | --- | --- |
| 50 | 1.54 | 95.24 |
| 100 | 3.46 | 0.75 |
| 200 | 3.54 | 0.91 |
| 300 | 3.64 | 0.85 |

Figure 9:
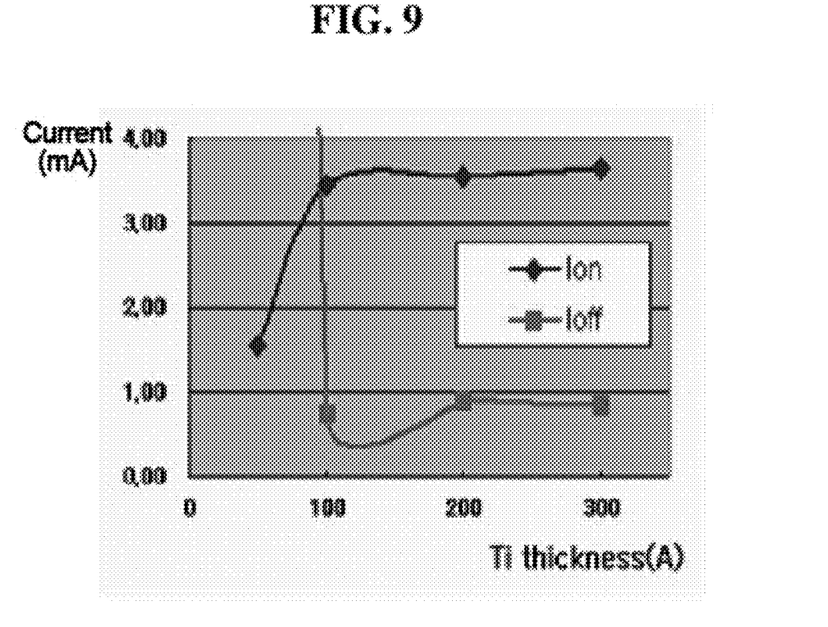
FIG. 9 is a graph illustrating current characteristics of a conventional TFT with respect to a thickness of a Titanium layer according to exemplary embodiments of the present invention.

Referring to TABLE 1 and FIG. 9, when the Ti layer has a thickness of less than 100 Å (e.g., a thickness of 50 Å), the ON current Ion may be undesirably low, whereas the OFF current Ioff sharply may be undesirably high. This indicates that the thickness of the Ti layer of the conventional TFT should not be reduced to less than 100 Å.

Figure 10:
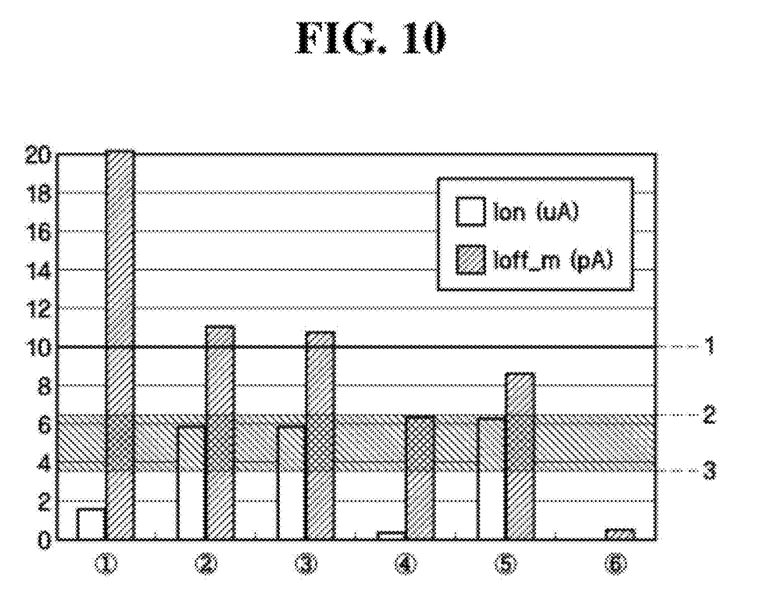
FIG. 10 is a graph illustrating the ON current and the OFF current with respect to a TFT structure according to exemplary embodiments of the present invention.
Figure 11:
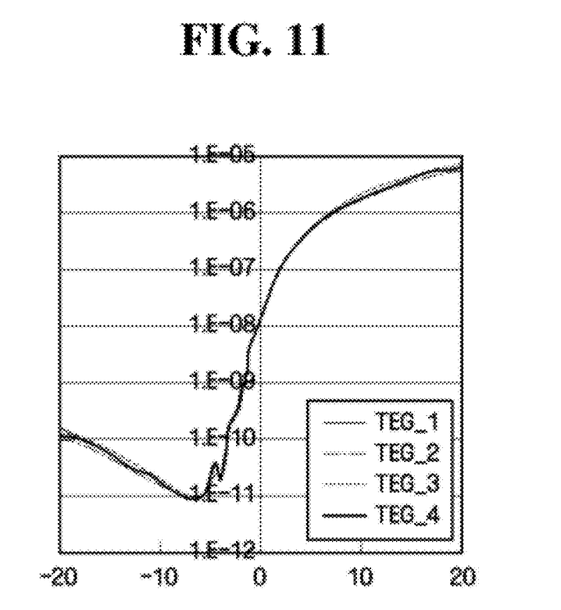
FIG. 11 is a graph illustrating an I-V curve of a TFT structure of FIG. 8 according to the exemplary embodiments of the present invention.

Current characteristics of a TFT according to exemplary embodiments of the present invention will now be described with reference to FIG. 10 and FIG. 11. FIG. 10 is a graph illustrating the ON current Ion and the OFF current Ioff with respect to the TFT substrates according to exemplary embodiments of the present invention. FIG. 11 is a graph illustrating an I-V curve of the TFT substrate illustrated in FIG. 8. FIG. 10 and FIG. 11 illustrate the ON/OFF current and the I-V curve when the source electrode and the drain electrode are made of double layers of Ti and Cu and when the Ti layer has a thickness of 50 Å.

Referring to FIG. 10, an optimal OFF current value of a TFT may be 10 pA or less (below dotted line 1 in FIG. 10), and an optimal ON current value of the TFT may be 3.8 to 6.2 uA (between dotted lines 2 and 3 in FIG. 10).

When a TFT, like the conventional TFT, does not have a diffusion-preventing layer on an ohmic contact layer and the thickness of a lower layer (e.g., the Ti layer) of the source electrode and the drain electrode is 50 Å, the values of the ON current Ion and the OFF current Ioff are outside the optimal ranges, as shown by ① in FIG. 10. The values of the ON current Ion and the OFF current Ioff are not optimal because the Ti layer cannot properly function as a diffusion-preventing layer.

In addition, the values of the ON current Ion and the OFF current Ioff may correspond to ④ in FIG. 10 when the diffusion-preventing layer is formed on the ohmic contact layer of the TFT by using a CVD method or to ⑥ in FIG. 10 when the diffusion-preventing layer and an additional ohmic contact layer are formed on the ohmic contact layer by using the CVD method. The values of the ON current Ion in ④ and ⑥ may also be very low, falling outside the optimal range, since a thick diffusion-preventing layer does not enable an ohmic contact layer to properly function as an ohmic contact.

On the contrary, when the diffusion-preventing layer is formed on the ohmic contact layer of the TFT by using $N_2$ plasma treatment (see ② in FIG. 10) or when the diffusion-preventing layer is formed by flowing $N_2$ (see ③ in FIG. 10), the values of the OFF current Ioff are much lower than that in ①. The values of the OFF current Ioff may be close to the optimal range while the values of the ON current Ion may be within the optimal range. Further, when the diffusion-preventing layer is formed on the ohmic contact layer of the TFT by flowing $N_2$ and when another ohmic contact layer is additionally formed on the diffusion-preventing layer, the values of the ON current Ion and the OFF current Ioff may both be within the optimal ranges (see ⑤ in FIG. 10).

Referring to FIG. 11, a normal I-V curve may be generated as a result of measuring the variation in current with respect to a voltage applied to a gate electrode of a TFT that includes the structure of ⑤ in FIG. 10, as described above. The I-V curve indicates a low output current in a negative-voltage section in which a gate-off voltage is applied and a high output current in a positive-voltage section in which a gate-on voltage is applied.

It can be understood from FIG. 10 and FIG. 11 that, according to the exemplary embodiments of the present invention, a reduction in the thickness of a lower layer (e.g., a Ti layer) of the source electrode and the drain electrode does not result in the deterioration of current characteristics of a TFT.

The TFT substrate disclosed according to exemplary embodiments of the invention may be used in various types of electronic devices, and is not limited to LCDs. For example, the TFT described herein may be used in portable devices, camera devices, navigation devices, and various other devices. Furthermore, while the TFT substrates described according to exemplary embodiments of the invention correspond to a bottom gate TFT, exemplary embodiments of the invention are not limited thereto, and various other modifications and configurations of the TFT substrate may be used. For instance, a top gate TFT substrate may similarly be implemented to reduce a lower layer (e.g., a Ti layer) of a source electrode and a drain electrode of the TFT substrate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin-film transistor (TFT), comprising:
   a gate electrode disposed on a substrate;
   an insulating layer disposed on the substrate and the gate electrode;
   an active layer pattern disposed on the insulating layer, the active layer pattern overlapping the gate electrode;
   a source electrode disposed on the insulating layer and overlapping at least part of the active layer pattern;
   a drain electrode disposed on the insulating layer, spaced apart from the source electrode, and overlapping at least part of the active layer pattern; and
   a first ohmic contact layer pattern disposed between the active layer pattern and the source electrode and between the active layer pattern and the drain electrode,
   wherein the first ohmic contact layer comprises a nitride layer and a non-nitride layer, the nitride layer being disposed on the non-nitride layer within the first ohmic contact layer.

2. The TFT of claim 1, wherein the source electrode and the drain electrode each comprise at least one layer, the at least one layer comprising two or more metals, a lowest layer of the at least one layer comprising Titanium (Ti).

3. The TFT of claim 1, wherein the source electrode and the drain electrode comprise a Titanium (Ti) layer and a Copper (Cu) layer, and
   wherein the Ti layer and the Cu layer are sequentially stacked.

4. The TFT of claim 1, further comprising a second ohmic contact layer pattern disposed on the first ohmic contact layer pattern.

5. The TFT of claim 2, wherein a thickness of the Ti layer is smaller than 100 Å.

6. The TFT of claim 5, wherein the thickness of the Ti layer is greater than 10 Å.

7. A thin-film transistor (TFT), comprising:
   an ohmic contact layer pattern disposed between an active layer pattern and a source electrode and between the active layer pattern and a drain electrode; and
   a diffusion-preventing layer pattern disposed between a first portion of the ohmic contact layer pattern and a portion of the source electrode and between a second portion of the ohmic contact layer pattern and a portion of the drain electrode,
   wherein the ohmic contact layer pattern and the diffusion-preventing layer pattern have substantially the same pattern, and
   wherein the diffusion-preventing layer comprises a titanium layer of the source electrode, a titanium layer of the drain electrode, and a nitride layer of the ohmic contact layer pattern.

8. The TFT of claim 7, further comprising:
a gate electrode; and
an insulating layer disposed between the gate electrode and the active layer pattern,
wherein the source electrode is disposed corresponding to a first portion of the active layer pattern, and
wherein the drain electrode is disposed corresponding to a second portion of the active layer pattern, the drain electrode being spaced apart from the source electrode.

9. The TFT of claim 7, wherein the ohmic contact layer pattern and the diffusion-preventing layer pattern have substantially the same pattern as the active layer pattern except in a channel region of the active layer pattern.

10. The TFT of claim 7, wherein a thickness of the diffusion-preventing layer pattern is between 10 Å and 100 Å.

* * * * *